(12) United States Patent
Foster et al.

(10) Patent No.: US 9,831,100 B2
(45) Date of Patent: Nov. 28, 2017

(54) SOLUTION BASED ETCHING OF TITANIUM CARBIDE AND TITANIUM NITRIDE STRUCTURES

(71) Applicants: Intermolecular Inc., San Jose, CA (US); International Business Machines, Armonk, NY (US)

(72) Inventors: John Foster, Mountain View, CA (US); Sean Lin, Watervliet, NY (US); Muthumanickam Sankarapandian, Yorktown Heights, NY (US); Ruilong Xie, Niskayuna, NY (US)

(73) Assignees: Intermolecular, Inc., San Jose, CA (US); International Business Machines, Armonk, NY (US)

( * ) Notice: Subject to any disclaimer, the term of this patent is extended or adjusted under 35 U.S.C. 154(b) by 0 days.

(21) Appl. No.: 14/313,120

(22) Filed: Jun. 24, 2014

(65) Prior Publication Data

US 2015/0371872 A1    Dec. 24, 2015

(51) Int. Cl.
  *H01L 21/336*    (2006.01)
  *H01L 21/3213*   (2006.01)
  *H01L 21/67*     (2006.01)
  *H01L 21/28*     (2006.01)
  *H01L 29/66*     (2006.01)

(52) U.S. Cl.
  CPC .. *H01L 21/32134* (2013.01); *H01L 21/28088* (2013.01); *H01L 21/67086* (2013.01); *H01L 29/66545* (2013.01)

(58) Field of Classification Search
  CPC ......... H01L 21/32134; H01L 21/31111; H01L 21/28088
  See application file for complete search history.

(56) References Cited

U.S. PATENT DOCUMENTS

| | | |
|---|---|---|
| 5,419,805 A | 5/1995 | Jolly |
| 6,200,910 B1 | 3/2001 | O'Brien et al. |
| 6,492,271 B1 | 12/2002 | Uozumi |
| 7,244,682 B2 | 7/2007 | Shea |
| 7,741,230 B2 | 6/2010 | Rachmady |
| 2013/0026637 A1* | 1/2013 | Hou ................. H01L 21/28088 257/770 |

(Continued)

*Primary Examiner* — Cory Eskridge

(57) ABSTRACT

Provided are methods for fabricating transistors using a gate last approach. These methods involve etching of titanium nitride and titanium carbide structures while preserving high k-dielectric structures. The titanium carbide structures may also include aluminum. Etching may be performed in one or more etching solutions, each including hydrogen peroxide. Titanium nitride and titanium carbide structures can be etched simultaneously (non-selectively) in the same etching solution that also includes hydrochloric acid, in addition to hydrogen peroxide, and maintained at about 25° C. and 85° C. In some embodiments, titanium nitride structures and titanium carbide structures may be etched separately (selectively) in different operations and using different etching solutions. The titanium nitride structures may be etched in a diluted hydrogen peroxide solution maintained at about 25° C. and 85° C. The titanium carbide structures may be etched in a solution that also includes ammonium hydroxide, in addition to hydrogen peroxide, and maintained at about 25° C.

18 Claims, 4 Drawing Sheets

(56) References Cited

U.S. PATENT DOCUMENTS

| | | | |
|---|---|---|---|
| 2013/0203231 A1* | 8/2013 | Fitzsimmons | H01L 21/82384 438/299 |
| 2013/0256802 A1* | 10/2013 | Jagannathan | H01L 21/28518 257/368 |
| 2013/0260549 A1* | 10/2013 | Jagannathan | H01L 21/28518 438/592 |
| 2014/0154877 A1* | 6/2014 | Besser | H01L 29/4966 438/586 |
| 2015/0132953 A1* | 5/2015 | Nowling | H01L 21/32133 438/692 |
| 2015/0270373 A1* | 9/2015 | Horak | H01L 29/66545 257/401 |

* cited by examiner

↓ *Non-Selective Etching*

SOLUTION BASED ETCHING OF TITANIUM CARBIDE AND TITANIUM NITRIDE STRUCTURES

BACKGROUND

In modern integrated circuit (IC) devices, such as complementary metal oxide silicon (CMOS) transistors, etching processes are becoming increasingly important, in particular etching of metal containing materials, such as metal carbides, metal nitrides, and the like. These metal containing materials are used for various different applications, such as fabricating small scale transistor components. For instance, metal containing materials may be used to replace polysilicon in gate electrodes. Metal containing materials may be also used for barrier layers, work function layers, and other like components. Often different components on a same device need to be etched in a controlled manner, such as using specific etching rates and without damaging other components on the same device. For example, two components may need to be etched simultaneously using substantially the same etching rates while preserving a third component. Alternatively, each component may need to be etched one at a time. As new metal containing materials are adopted for semiconductor applications, new etching techniques are needed.

SUMMARY

Provided are methods for fabricating transistors using a gate last approach. These methods involve etching of titanium nitride and titanium carbide structures while preserving high k-dielectric structures. The titanium carbide structures may also include aluminum. Etching may be performed in one or more etching solutions, each including hydrogen peroxide. Titanium nitride and titanium carbide structures can be etched simultaneously (non-selectively) in the same etching solution that also includes hydrochloric acid, in addition to hydrogen peroxide, and maintained at about 25° C. and 85° C. In some embodiments, titanium nitride structures and titanium carbide structures may be etched separately (selectively) in different operations and using different etching solutions. The titanium nitride structures may be etched in a diluted hydrogen peroxide solution maintained at about 25° C. and 85° C. The titanium carbide structures may be etched in a solution that also includes ammonium hydroxide, in addition to hydrogen peroxide, and maintained at about 25° C.

In some embodiments, a method for fabricating a transistor using a gate last approach involves providing an assembly including a semiconductor substrate, a first structure, a second structure, and a third structure. The first structure is disposed on the semiconductor substrate and includes titanium nitride. The second structure is also disposed on the semiconductor substrate and includes titanium carbide. The first and second structures may be used as diffusion barrier structures, interconnects, electrodes, work function structures, and other types of structures. The third structure is disposed on the semiconductor substrate and includes a high k dielectric material, such as hafnium oxide or zirconium oxide. In some embodiments, the semiconductor substrate includes a trench. The first structure, the second structure, and the third structure are disposed in that trench. In some embodiments, the second structure also includes aluminum. The concentration of aluminum in the second structure may be less than about 70% atomic or, more specifically, less than about 50% atomic and even less than about 30% atomic.

The method proceeds with exposing the semiconductor substrate to one or more etching solutions. Each etching solution includes hydrogen peroxide. Other components may be hydrochloric acid, ammonium hydroxide, and/or water. In some embodiments, one etching solution is used to non-selectively etch both first and second structures in the same operation. Alternatively, two different etching solutions may be used to selectively etch each of the first and second structures. These examples are further described below.

The method proceeds with etching the first structure and the second structure while the semiconductor substrate is exposed to the one or more etching solutions. During etching of the first structure and the second structure, the third structure is exposed to the one or more etching solutions for at least a portion of time. In some embodiments, the third structure is exposed to the one or more etching solutions during the entire etching duration. Alternatively, the third structure may be covered by the first structure and/or by the second structure. In this case, the third structure becomes exposed to the one or more etching solutions when the first structure and/or the second structure is at least partially removed from the top of the third structure. For example, the third structure may become exposed for a short period of time at the end of the etching operation. It should be noted that some portions of the third structure may be exposed to the one or more etching solutions for longer periods of time than other portions. For purposes of this document, "the third structure being exposed to the one or more etching solutions for at least a portion of time" means that the third structure may be exposed for the entire duration of the etching operation or only for a portion thereof. Even though the third structure is exposed to the one or more etching solutions, it remains substantially intact during etching of the first structure and the second structure. In some embodiments, the third structure loses less than 10% of its volume during the etching operation or, more specifically, less than 1% of its volume. This preservation of the third structure is achieved by selecting etching process conditions with low selectivities to the third structure materials.

In some embodiments, the first structure and the second structure are etched in a same etching solution. In other words, one etching solution is used to etch the first and second structures in the same etching operation. To ensure that both structures are removed to the same level for a given duration of the etching operation, the etching rates need to be approximately the same. The ratio of etching rates for two different structures may be expressed as an etching selectivity. In some embodiments, a ratio of an etching rate of the first structure to an etching rate of the second structure (or an etching selectivity of the first structure to the second structure) is between about 0.2 and 5 or, more specifically, between about 0.5 and 1.5 or about 1. In other words, a non-selective etch is performed. The etching rate of the first structure and the etching rate of the second structure may be between about 15 Angstroms per minute and 150 Angstroms per minute.

The etching solution used for this non-selective etch may include hydrochloric acid in addition to hydrogen peroxide. In some embodiments, the weight ratio of hydrogen peroxide to hydrochloric acid in this etching solution is between about 1 and 2, or more specifically, between about 1 and 1.5, such as about 1.2. The etching solution may include water. The weight ratio of water to hydrogen peroxide in the same etching solution is between about 30 and 100 or, more specifically, between about 40 and 60, such as about 55. This etching solution may be maintained at a temperature of between about 25° C. and 85° C. during etching of the first structure and the second structure or, more specifically, at about 60° C.

In some embodiments, the first structure is etched in a first etching solution while the second structure is etched in a second etching solution. This type of etching may be referred to as selective etching. In this selective etching, the etching selectivity of the first structure to the second structure may be substantially greater than 1 when the assembly is exposed to the first etching solution and substantially less than 1 when the assembly is exposed to the second etching solution. The compositions of the first etching solution and the second etching solution are different. Other process conditions, such as the etching solution temperature, may be different as well between the two etching operations.

In some embodiments, the first etching solution includes water in addition to hydrogen peroxide. The weight ratio of water to hydrogen peroxide in the first etching solution may between about 1 and 10 or, more specifically, between about 2 and 6, such as about 4.5. The first etching solution may be maintained at a temperature of between about 25° C. and 85° C. during etching of the first structure, such as about 60° C. In some embodiments, an etching rate ratio of the second structure to the first structure in the first etching solution is less than about 0.1. In other words, the first structure etches faster than the second structure in the first etching solution.

The second etching solution may include ammonium hydroxide. The weight ratio of ammonium hydroxide to hydrogen peroxide in the second etching solution may be between about 0.5 and 2. The second etching solution may be maintained at a temperature of between about 20° C. and 30° C. during etching of the second structure. In some embodiments, an etching rate ratio of the first structure to the second structure in the second etching solution is less than about 0.1. In other words, the second structure etches faster than the first structure in the second etching solution. The second structure may be etched before the first structure.

In some embodiments, a method for fabricating a transistor according to a gate last approach involves providing an assembly including a semiconductor substrate, a first structure, a second structure, and a third structure. The first structure is disposed on the semiconductor substrate and includes titanium nitride. The second structure is disposed on the semiconductor substrate and includes titanium carbide. The third structure is disposed on the semiconductor substrate and includes a high-k dielectric material. The method proceeds with exposing the semiconductor substrate to an etching solution including hydrogen peroxide and hydrochloric acid. The weight ratio of hydrogen peroxide to hydrochloric acid is between about 1 and 2. The method then proceeds with etching the first structure and the second structure while the semiconductor substrate is exposed to the etching solution. The etching solution is maintained at a temperature of between about 25° C. and 85° C. during etching of the first structure and the second structure. During this etching, the third structure is exposed to the etching solution for at least a portion of time. However, the third structure remains substantially intact while the first structure and the second structure are at least partially removed.

In some embodiments, a method for fabricating a transistor according to a gate last approach involves providing an assembly including a semiconductor substrate, a first structure, a second structure, and a third structure. The first structure disposed on the semiconductor substrate and includes titanium nitride. The second structure is disposed on the semiconductor substrate and includes titanium carbide. The third structure is disposed on the semiconductor substrate and includes a high-k dielectric material. The method then proceeds with exposing the semiconductor substrate to a first etching solution including hydrogen peroxide and water. The method proceeds with etching the first structure while the semiconductor substrate is exposed to the first etching solution. During etching of the first structure, the second structure and the third structure are exposed to the first etching solution for at least a portion of time. The third structure remains substantially intact during etching of the first structure. In some embodiments, the second structure also remains substantially intact. The method then proceeds with exposing the semiconductor substrate to a second etching solution. The second etching solution includes hydrogen peroxide and ammonium hydroxide. The method proceeds with etching the second structure while the semiconductor substrate is exposed to the second etching solution. During etching of the second structure, the first structure and the third structures are exposed to the second etching solution for at least a portion of time. The third structure remains substantially intact during etching of the second structure. In some embodiments, the first structure also remains substantially intact during etching of the second structure.

These and other embodiments are described further below with reference to the figures.

DETAILED DESCRIPTION OF EXAMPLE EMBODIMENTS

Figure 1:
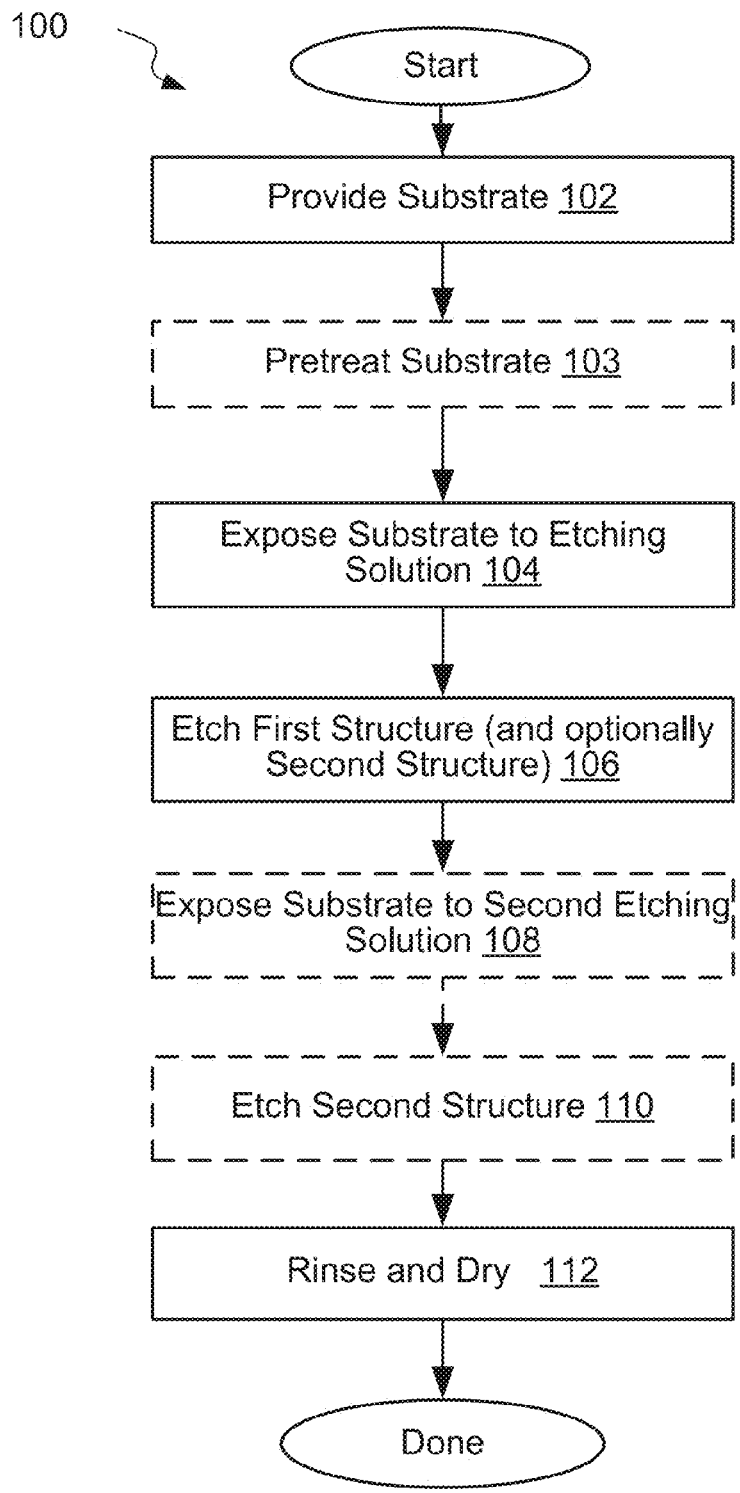
FIG. 1 illustrates a process flowchart corresponding to a method of processing a semiconductor substrate to remove titanium carbide and titanium nitride structures, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

As the CMOS pitch size is being continuously scaled down to sub-64 nanometer dimensions, self-aligned contacts (SAC) are used to avoid polysilicon (PC) to CA short circuits, i.e., shorts between the gate and the source or the gate and the drain. One of the main requirements for the SAC is for the gate to be encapsulated with a material sufficiently different from an inter-layer dielectric. For the gate first process flow, the gate can be easily encapsulated with a dielectric material by adding a polysilicon hardmask. However, for the gate last process flow, this polysilicon hardmask approach cannot be utilized. In this latter case, a dummy poly gate structure is formed first and then removed and replaced with a metal gate structure. This gate replacement process may utilize one or more metal layers, such as titanium nitride layers and titanium carbide layers. For example, a titanium nitride layer may be used as a capping layer over a high-k dielectric layer during the gate replacement process. A titanium carbide layer may be operable as a work function layer or another capping layer. In some embodiments, a titanium nitride layers and a titanium carbide layer are present on the same device and need to be partially removed without, for example, damaging a high-k dielectric layer provided in the same structure. Various examples of such structures before and after etching are described below with reference to FIGS. 2A-2B and FIGS. 3A-3C.

Provided herein are methods for fabricating transistors using the gate last approach. These methods involve etching of titanium nitride and titanium carbide structures while preserving high k-dielectric structures that also become exposed to etching solutions when the titanium nitride and titanium carbide structures are being etched. Etching may be performed in one or more etching solutions, each including hydrogen peroxide. For example, both titanium nitride and titanium carbide structures can be etched at the same time (non-selectively) in the same etching solution. In addition to hydrogen peroxide, this etching solution may include hydrochloric acid. The solution may be kept at about 25° C. and 80° C. during etching to maintain the desired selectivity and etching rate values. Alternatively, titanium nitride structures and titanium carbide structures may be etched separately (selectively) in different operations and using different etching solutions. Specifically, the titanium nitride structures may be etched in a diluted hydrogen peroxide solution maintained at about 25° C. and 100° C. The titanium carbide structures may be etched in a solution that also includes ammonium hydroxide, in addition to hydrogen peroxide, and maintained at a room temperature. Various aspects of these operations will be now described in more detail with reference to FIG. 1.

Processing Examples

FIG. 1 illustrates a process flowchart corresponding to method 100 for fabricating a transistor using a gate last approach or, more specifically, to remove titanium carbide and titanium nitride structures, in accordance with some embodiments. Method 100 may be a part of a larger process of fabricating CMOS devices using the transistor(s), which would be understood by one having ordinary skills in the art. Method 100 may commence with providing an assembly including a semiconductor substrate, a first structure, a second structure, and a third structure during operation 102. The first structure is disposed on the semiconductor substrate and includes titanium nitride. The second structure is disposed on the semiconductor substrate and includes titanium carbide. Finally, the third structure is also disposed on the semiconductor substrate and includes a high-k dielectric material.

Figure 2A:
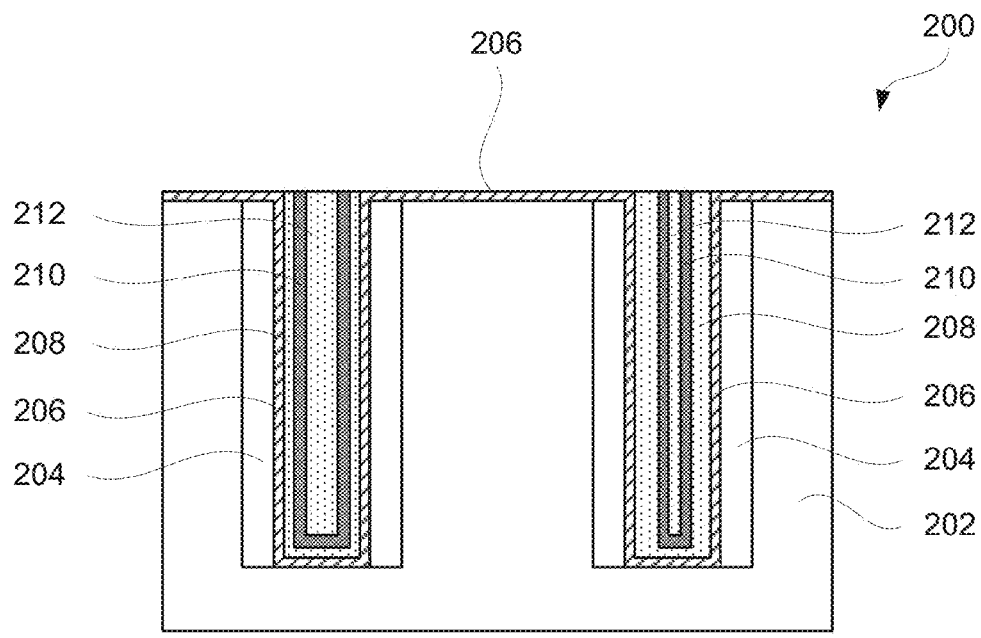
FIGS. 2A and 2B illustrate schematic representations of a semiconductor substrate before and after etching of titanium carbide and titanium nitride structures using non-selective etching, in accordance with some embodiments.

One example of such an assembly is shown in FIG. 2A. Specifically, assembly 200 includes substrate 202, high-k gate dielectric layer 206 (i.e., the third structure in the description of the method), and two metal containing layers 208 and 210 (i.e., the first and second structures, respectively, in the description of the method). Substrate 202 may be made from or include a dielectric layer, which may be formed by chemical vapor deposition (CVD), high density plasma CVD, spin-on, sputtering, or other suitable methods. The dielectric layer may include silicon oxide, silicon oxynitride, or a low-k material. High-k gate dielectric layer 206 may include hafnium oxide ($HfO_2$) or zirconium oxide ($ZrO_2$). Other examples of suitable materials include hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide (ZrOx), combinations thereof, and/or other suitable materials. High-k gate dielectric layer 206 may be deposited using atomic layer deposition (ALD), CVD, and other suitable techniques. In some embodiments, the thickness of high-k gate dielectric layer 206 is between about 1 nanometers and 10 nanometers. Since high-k gate dielectric layer 206 is relatively thin, etching of this layer should be minimized or prevented while etching two metal containing layers 208 and 210.

To provide some reference, FIG. 2A also illustrates spacers 204 disposed on both sides of each trench. Spacers 204 may be formed of silicon oxide, silicon nitride, silicon oxynitride, silicon carbide, fluoride-doped silicate glass (FSG), a low k dielectric material, combinations thereof, and/or other suitable material. In some embodiments, spacers 204 may have a multiple layer structure.

Two metal containing layers 208 and 210 may be deposited to partially fill in each trench. Specifically, layers 208 and 210 are shown deposited over high-k gate dielectric layer 206 at least in the trench. As such, layers 208 and 210 may protect at least a portion of high-k gate dielectric layer 206 for a period of time during etching of layers 208 and 210. Layers 208 and 210 may be made from any metal containing materials suitable for forming a metal gate or portion thereof, including work function layers, liner layers, interface layers, seed layers, adhesion layers, barrier layers, and the like. In a specific example described herein, metal containing layer 208 includes titanium nitride, while metal containing layer 210 includes titanium carbide. In some embodiments, layer 210 also includes aluminum. The concentration of aluminum in layer 210 may be less than about 70% atomic or, more specifically, less than about 50% atomic or even less than about 30% atomic. Another structure 212 formed from titanium nitride may be used to fill the remainder of the trench. It should be noted that one or more of these structures may be formed from other materials. For example, structure 212 may include, tungsten (W), aluminum (Al), titanium (Ti), tantalum (Ta), tantalum nitride (TaN), cobalt (Co), copper (Cu), nickel (Ni), combinations thereof, and/or other suitable materials. Metal layers 208 and 210 may include one or more layers including titanium (Ti), tantalum nitride (TaN), tantalum (Ta), tantalum carbide (TaC), tantalum silicon nitride (TaSiN), tungsten (W), tungsten nitride (WN), molybdenum nitride (MoN), molybdenum oxynitride (MoON), and/or other suitable materials.

Other components of assembly 200 not shown in FIG. 2A may include shallow trench isolation (STI) structures formed in substrate 202 that may isolate one or more devices from each other. The STI structures may include silicon oxide, silicon nitride, silicon oxynitride, fluoride-doped silicate glass (FSG), and/or a low k dielectric material. Furthermore, the assembly may include a contact etch stop layer (CESL) formed of silicon nitride, silicon oxynitride, and/or other suitable materials.

Returning to FIG. 1, method 100 may proceed with exposing the semiconductor substrate to an etching solution during operation 104. In some embodiments, the semiconductor substrate is first exposed to one etching solution during operation 104 and then to another etching solution during optional operation 108. Alternatively, operation 108 is not performed, and the semiconductor substrate is exposed only to one etching solution during operation 104. In this case, the same etching solution is used to etch the first and second structures. Regardless whether operation 108 is performed, the etching solution used during operation 104 includes hydrogen peroxide. If operation 108 is performed, then the etching solution used during operation 108 also includes hydrogen peroxide.

Embodiments in which operations 108 and 110 are not performed will first be described. In these embodiments, the first structure and the second structure are etched in the same etching solution. In addition to hydrogen peroxide, this etching solution includes hydrochloric acid. The weight ratio of hydrogen peroxide to hydrochloric acid in that etching solution may be between about 0.5 and 2 or, more specifically, between 1 and 1.5, such as around 1.2. In some embodiments, the concentration of hydrogen peroxide in this etching solution may be between about 1% and 3% by weight or, more specifically, between about 1.5% and 2% by weight, such as about 1.75% by weight. The concentration of hydrochloric acid in the etching solution may be between about 0.75% and 3% by weight or, more specifically, between about 1% and 2% by weight, such as about 1.5% by weight. The etching solution may also include water. In some embodiments, the weight ratio of water to hydrogen peroxide in this etching solution is between about 10 and 100 or, more specifically, between about 50 and 60, such as about 55. The etching solution may be maintained at a temperature of between about 25° C. and 85° C. or more, specifically, between 50° C. and 70° C., such as about 60° C. during etching of the first structure and the second structure.

Figure 2B:
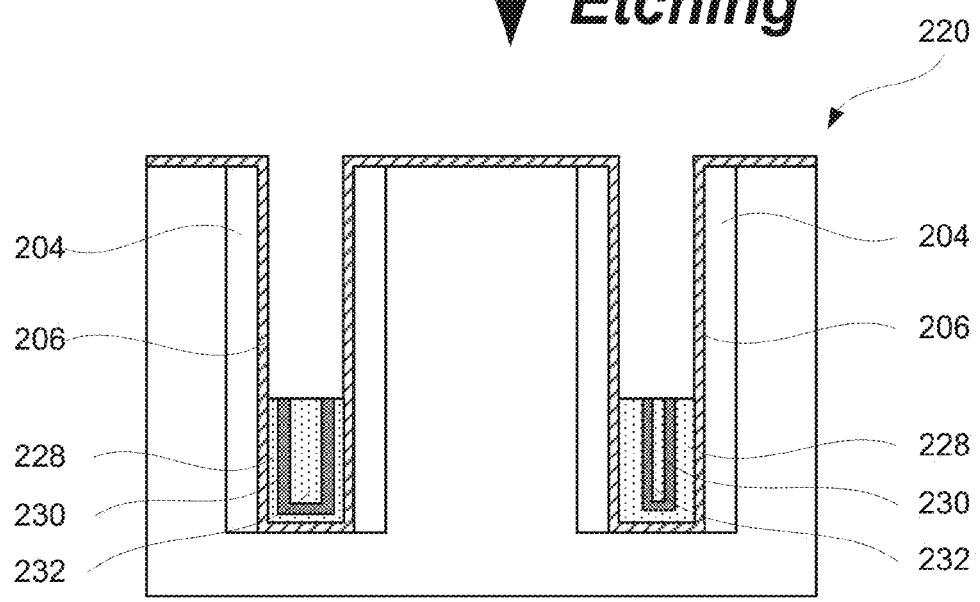

During operation 106, the first and second structures are etched and at least partially removed. FIG. 2B illustrates assembly 220 after the etching operation with two metal layers 228 and 230 shown partially removed. Filling structure 232 is also partially removed. It should be noted that high-k gate dielectric layer 206 remained substantially intact after the etching operation.

The etching conditions are selected in such a way that etching rates of the titanium nitride structures and the titanium carbide structures are comparable while etching rates of the high-k dielectric structure are substantially smaller that the etching rates of the titanium nitride structures and the titanium carbide structures. In some embodiments, the etching rate ratio of the titanium nitride structure to the etching rate of the titanium carbide structure (i.e., the etching selectivity of the titanium nitride structure to the etching rate of the titanium carbide structure) may be between about 0.2 and 5 or more, specifically, between 0.5 and 2, such as about 1. The etching rate for both structures may be between about 15 Angstroms per minute and 150 Angstroms per minute. At the same time the etching rate of the high-k dielectric structure may be less than about 5 Angstroms per minute or even less than about 1 Angstrom per minute during this operation.

As further described below in the experimental results, it has been found that reducing the concentration of hydrochloric acid relative to the concentration of hydrogen peroxide decreases the TiN:TiC selectivity. At the same time increasing the etching temperature decreases the TiN:TiC selectivity. For the non-selective etch operation describe above, it may be desirable to keep the value of this selectivity close to 1 to the extent possible.

In some embodiments, selective etching may be used. The selective etch may be needed when a particular order of etching is needed; that is, when one type of structures need to be removed before another type of structures. Selective etching involves operations 104 and 106 as well as operations 108 and 110. Specifically, operations 104 and 106 may be used for etching titanium nitride structures, while operations 108 and 110 may be used for etching titanium carbide structures, or vice versa. While the following descriptions focus on the first structure (i.e., the titanium nitride structure) being etched first, one having ordinary skills in the art would understand that the alternative process, in which the second structure (i.e., the titanium carbide structure) is removed first, is also within the scope.

In these embodiments, the first structure is etched in a first etching solution during operation 106, while the second structure is etched in a second etching solution during operation 110. The compositions of the first etching solution and the second etching solution are different. For example, the first etching solution includes water in addition to hydrogen peroxide. The weight ratio of water to hydrogen peroxide in the first etching solution may be between about 1 and 10 or, more specifically, between about 3 and 6, such as around 4.5. The concentration of hydrogen peroxide in the first solution may be between about 10% and 30 by weight or, more specifically, between about 15% by weight and 28% by weight, such as about 22% by weight. In some embodiments, hydrogen peroxide and water are the only components in the first etching solution. The first etching solution may be maintained at a temperature of between about 25° C. and 85° C. during etching of the first structure or, more specifically, at between about 40° C. and 70° C., such as at about 60° C.

This first etching solution etches the first structure during operation 106, while the second structure and the third structure may remain substantially intact during this operation. In some embodiments, the ratio of an etching rate of the second structure to an etching rate to the first structure in the first etching solution is less than about 0.1.

As further described below in the experimental results, it has been found that increasing the concentration of hydrogen peroxide actually reduces the etching rate of titanium nitride. Furthermore, it has been found that a temperature is a major factor for the etching rate. For example, increasing the temperature from 25° C. to 85° C. increases the etching rate of titanium nitride by almost 10 times. As such, the process conditions described above for operation 106 ensures the high selectivity of the first structure to the second structure.

Figure 3A:
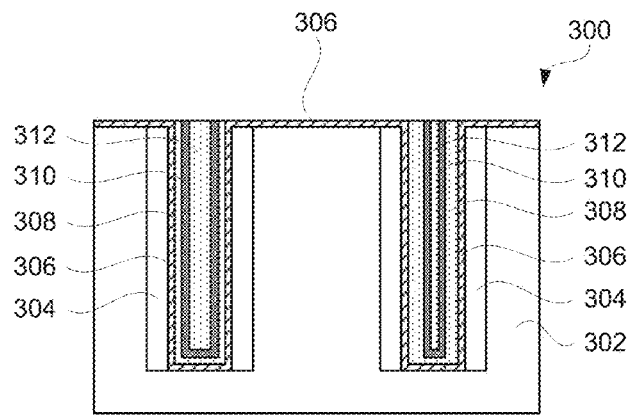
FIG. 3A illustrates a schematic representation of a semiconductor substrate before etching of titanium carbide and titanium nitride structures, in accordance with some embodiments.

FIG. 3A illustrates a schematic representation of a semiconductor substrate before etching of titanium carbide and titanium nitride structures, in accordance with some embodiments. FIG. 3A is similar to FIG. 2A described above. Specifically, assembly 300 includes substrate 302, high-k gate dielectric layer 306 (i.e., the third structure in the description of the method), and two metal containing layers 308 and 310 (i.e., the first and second structures, respectively, in the description of the method). FIG. 3A also illustrates spacers 304 disposed on both sides of each trench.

Two metal containing layers 308 and 310 may be deposited to partially fill in each trench. Specifically, layers 308 and 310 are shown deposited over high-k gate dielectric layer 306 at least in the trench. Another structure 312 formed from titanium nitride may be used to fill the remainder of the trench. It should be noted that one or more of these structures may be formed from other materials.

Figure 3B:
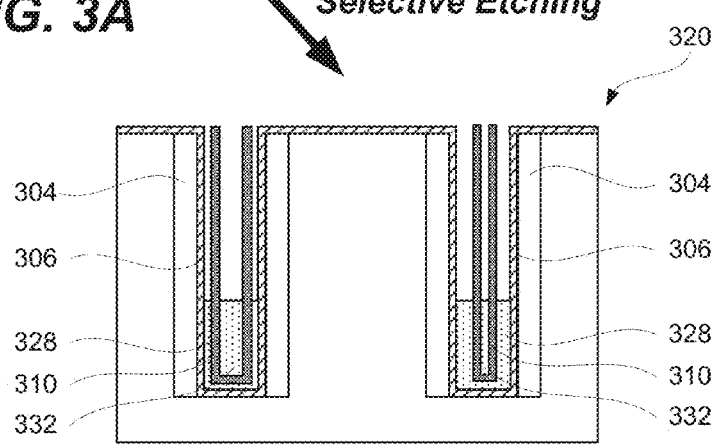
FIG. 3B illustrates a schematic representation of the semiconductor substrate shown in FIG. 3A after selective etching the titanium carbide structures but not the titanium nitride structures, in accordance with some embodiments.
Figure 3C:
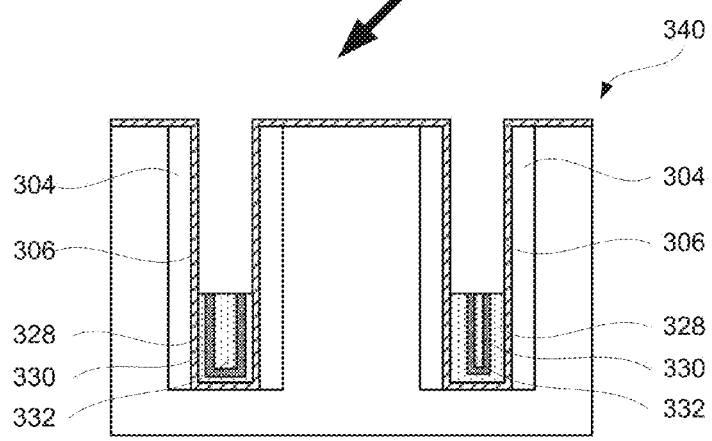
FIG. 3C illustrates a schematic representation of the semiconductor substrate shown in FIGS. 3A and 3B after selective etching the titanium nitride structures, in accordance with some embodiments.

FIG. 3B illustrates a schematic representation of assembly 320 shown in FIG. 3A after selectively etching the titanium carbide structures but not the titanium nitride structures, in accordance with some embodiments. Specifically, metal layers 328 and 332 are shown partially removed, while layer 310 remains substantially intact. It should be noted that high-k gate dielectric layer 306 also remains substantially intact after the etching operation.

Returning to FIG. 1, the second solution is used during operation 110 to etch the second structure. In some embodiments, the second etching solution includes ammonium hydroxide in addition to hydrogen peroxide. The weight ratio of ammonium hydroxide to hydrogen peroxide in the second etching solution may be between about 0.5 and 2, such as between about 0.75 and 1.2 or even about 1. In some embodiments, the concentration of ammonium hydroxide in the second solution is between about 0.2% and 2% by weight or, more specifically, between about 0.4% and 0.8% by weight, such as about 0.6% by weight. The concentration of hydrogen peroxide in the second solution may be between about 0.2% and 2% by weight or, more specifically, between about 0.4% and 0.8% by weight, such as about 0.6% by weight. The concentration of water in the second solution may be between about 0.2% and 2% by weight or, more specifically, between about 0.4% and 0.8% by weight, such as about 0.6% by weight. The remaining portion of the second solution may be water. The second etching solution may be maintained at a temperature of between about 20° C. and 30° C. during etching of the second structure. In some embodiments, the ratio of the etching rate of the first structure to the etching rate to the second structure in the second etching solution is less than about 0.1.

As further described below in the experimental results, it has been found that increasing the concentration of hydrogen peroxide relative to ammonium hydroxide decreases the selectivity of the titanium carbide to titanium nitride. This selectivity also decreases when the temperature is increased of the amount of water in the solution is increased (while keeping the relative concentrations of hydrogen peroxide and ammonium hydroxide the same).

FIG. 3B illustrates a schematic representation of assembly 340 after selectively etching the titanium nitride structures, in accordance with some embodiments. Now all metal layers 328, 330, and 332 are partially removed. High-k gate dielectric layer 206 remains substantially intact after this etching operation too.

Returning to FIG. 1, method 100 may proceed with may proceed with rinsing and drying the substrate during operation 112. The residual etching solution is removed from the substrate surface during this operation by, for example, rinsing the surface with deionized water and drying with an inert gas, such as nitrogen or argon.

Experimental Results

Various experiments have been conducted to determine effects of different processing conditions including different etching temperatures and different etching solution compositions on etching rates of titanium nitride and titanium carbide structures and, as a result, on the etching selectivity of these two structures. A first set of experiments involved testing of non-selective etching. In other words, processing conditions were varied to determine the closest titanium nitride and titanium carbide etching rates. Results of two such experiments are presented in Table 1 below. The compositions of etching solutions are presented as volume ratios of a 37% by weight water-based solution of hydrochloric acid, a 30% by weight water-based solution of hydrogen peroxide, and water. Both experiments presented in Table 1 used the 1:1.5:26 ratio of the hydrochloric acid solution, the hydrogen peroxide solution, and water. Two temperatures were tested. At 25° C., the solution did not yield any detectable etching rates. At 60° C., the titanium carbide etching rate was 54.3 Angstroms per minute, while the titanium nitride etching rate was 23 Angstroms per minute resulting in the TiC/TiN of 2.36. This is a suitable selectivity for non-selective etching.

TABLE 1

| Volume Ratio HCl:$H_2O_2$:Water | Temperature, ° C. | TiC Etch Rate, Å/min | TiN Etch Rate, Å/min | TiC/TiN Selectivity |
|---|---|---|---|---|
| 1:1.5:26 | 25 | <0.5 | <0.5 | N/A |
| 1:1.5:26 | 60 | 54.3 | 23.00 | 2.36 |

Other ratios of hydrochloric acid solution, hydrogen peroxide solution, and water yielded less desirable results. For example, the 1:10:100 ratio of the hydrochloric acid solution, the hydrogen peroxide solution, and water at 25° C. showed a substantially lower TiC/TiN selectivity, while the same etching solution at 60° C. cause the TiC/TiN selectivity to increase too high.

Another set of experiments involved selective etching of titanium nitride structures while preserving titanium carbide structures substantially intact. Etching solutions used in these experiments included a mixture of a 30% by weight water-based solution of hydrogen peroxide and water. No other components were used in these etching solutions. Etching solutions of three different concentrations of hydrogen peroxide were tested as shown in Table 2 below. Etching was performed at three different temperatures in each of these solutions. No detectable etching of the titanium carbide structures has been detected in any of these experiments. The highest etching rate of the titanium nitride structures was achieved at 80° C. with the 2.5:1 etching solution, i.e., the lowest concentration of hydrogen peroxide at the highest temperatures among all tested process conditions.

TABLE 2

| Volume Ratio $H_2O_2$:Water | Temperature, ° C. | TiC Etch Rate, Å/min | TiN Etch Rate, Å/min | TiC/TiN Selectivity |
|---|---|---|---|---|
| 2.5:1 | 40 | <0.5 | 7.32 | — |
| 2.5:1 | 60 | <0.5 | 33.63 | — |
| 2.5:1 | 80 | <0.5 | 64.5 | — |
| 10:1 | 40 | <0.5 | 1.48 | — |
| 10:1 | 60 | <0.5 | 36.27 | — |
| 10:1 | 80 | <0.5 | 56.83 | — |
| 40:1 | 40 | <0.5 | 1.45 | — |
| 40:1 | 60 | <0.5 | 8.12 | — |
| 40:1 | 80 | <0.5 | 40.96 | — |

In yet another set of experiments, selective etching of titanium carbide structures was tested. The compositions of etching solutions used in these experiments included a 37% by weight water-based solution of ammonium hydroxide, a 30% by weight water-based solution of hydrogen peroxide, and water. No other components were used in these etching solutions. Different temperature and etching solution compositions were tested as shown in Table 3 below. It was found that increasing the concentration of ammonium hydroxide relative to hydrogen peroxide helps to increase the TiC/TiN selectivity. For example, the selectivity increased from 6.09 for the 1:5:60 solution to 32.76 for the 5:1:60 solution, both tested at 25° C. At the same time, increasing the temperature generally reduced these selectivity values. For example, the 1:1.5:26 solution dropped its selectivity from 215.5 to 11.97 when the temperature was increased from 25° C. to 65° C.

TABLE 3

| Volume Ratio NH$_4$OH:H$_2$O$_2$:Water | Temp, ° C. | TiC Etch Rate, Å/min | TiN Etch Rate, Å/min | TiC/TiN Selectivity |
|---|---|---|---|---|
| 1:5:60 | 25 | 39 | 6.4 | 6.09 |
| 3:3:60 | 25 | 52 | 4.8 | 10.83 |
| 5:1:60 | 25 | 45.9 | 1.4 | 32.76 |
| 1:5:60 | 60 | >560 | 47.7 | — |
| 3:3:60 | 60 | >560 | 57.2 | — |
| 5:1:60 | 60 | >560 | 40.5 | — |
| 1:1:50 | 25 | 37.25 | 1.55 | 24.03 |
| 1:1:50 | 60 | 544.41 | 40.66 | 13.39 |
| 1:1:100 | 25 | 21.55 | 2.73 | 7.89 |
| 1:1:100 | 60 | 302.69 | 19.53 | 15.5 |
| 1:4:50 | 25 | 32.29 | 4.07 | 7.93 |
| 1:4:50 | 60 | 736.39 | 54.75 | 13.45 |
| 1:4:100 | 25 | 31.77 | 4.28 | 7.42 |
| 1:4:100 | 60 | 455.40 | 35.58 | 12.8 |
| 4:1:50 | 25 | 35.73 | 3.92 | 9.11 |
| 4:1:50 | 60 | 684.90 | 49.27 | 13.9 |
| 4:1:100 | 25 | 45.60 | 3.37 | 13.53 |
| 4:1:100 | 60 | 428.35 | 39.49 | 10.85 |
| 1:1.5:26 | 25 | 86.20 | 0.4 | 215.5 |
| 1:1.5:26 | 35 | 180.3 | 5.9 | 30.56 |
| 1:1.5:26 | 45 | 322 | 21.2 | 15.19 |
| 1:1.5:26 | 55 | 567 | 55.2 | 10.27 |
| 1:1.5:26 | 65 | 900 | 75.2 | 11.97 |

Apparatus Examples

Figure 4:
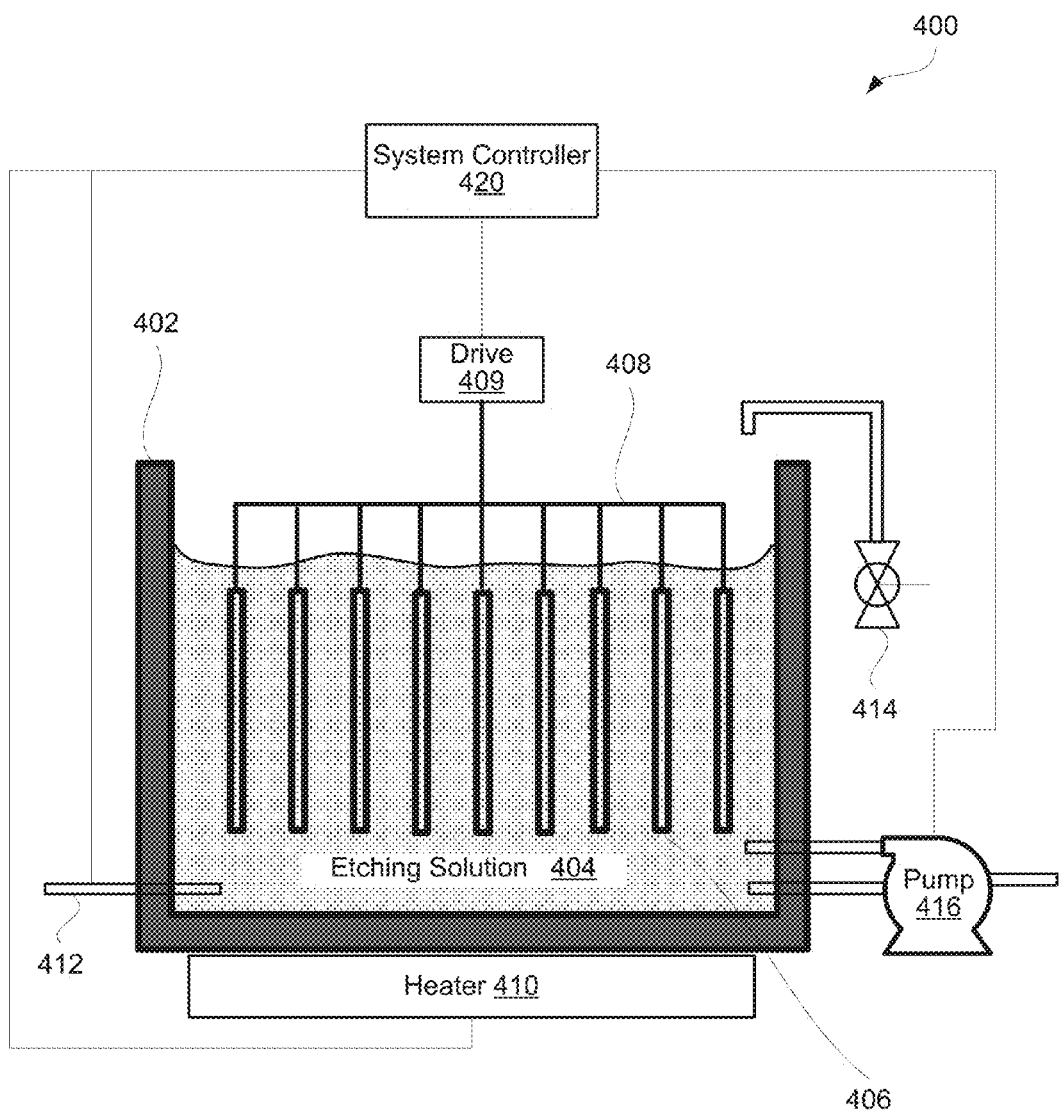
FIG. 4 illustrates a schematic representation of an etching apparatus for processing a semiconductor substrate to remove titanium nitride and titanium carbide structure, in accordance with some embodiments.

FIG. 4 illustrates a schematic representation of etching apparatus 400 for processing a semiconductor substrate to etch titanium nitride and titanium carbide, in accordance with some embodiments. For clarity, some components of apparatus 400 are not included in this figure. Apparatus 400 includes bath 402 for containing etching solution 404. One or more semiconductor substrates 406 may be immersed in etching solution 404 for processing or, more specifically, for removal of silicon nitride structures. Substrate 406 may be supported by substrate holder 408, which may be attached to drive 409 for moving substrate holder 408. Specifically, substrate holder 408 may be moved to immerse substrates 406 in etching solution 404 for processing, remove substrates 406 from etching solution 404 after processing, and/or to move substrates 406 within etching solution 404 during processing (e.g., to agitate etching solution 404).

Apparatus 400 also includes heater 410 and temperature sensor 412 (e.g., a thermocouple) for maintaining etching solution 404 at a predetermined temperature. Heater 410 and temperature sensor 412 may be connected to system controller 420, which may control power supplied to heater 410 based on signals received from temperature sensor 412. Various features of system controller 420 are described below.

Apparatus 400 may also include a liquid delivery system 414 for supplying additional liquids and controlling the composition of etching solution 404. For example, some components of etching solution 404 may evaporate from bath 402, and these components may be replenished in bath 402 by liquid delivery system 414. Liquid delivery system 414 may be connected to and controlled by system controller 420. Various sensors (e.g., conductivity sensor, weight sensor) may be used to provide signals about potential changes in composition of etching solution 404. Apparatus 400 may be also equipped with pump 416 for recirculating etching solution 404 in bath 402 and other purposes. Pump 416 may be also connected to and controlled by system controller 420.

Apparatus 400 may include system controller 420 for controlling process conditions during silicon nitride etching processes. Controller 420 may include one or more memory devices and one or more processors with a central processing unit (CPU) or computer, analog and/or digital input/output connections, stepper motor controller boards, and the like. In some embodiments, controller 420 executes system control software including sets of instructions for controlling timing of operations, temperature of etching solution 404, composition of etching solution 404, and other parameters. Other computer programs and instruction stored on memory devices associated with controller may be employed in some embodiments.

CONCLUSION

Although the foregoing concepts have been described in some detail for purposes of clarity of understanding, it will be apparent that some changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method comprising:
   providing a semiconductor substrate comprising a first structure, a second structure, and a third structure completely filling a trench in the semiconductor substrate,
      wherein the first structure comprises titanium nitride,
      wherein the second structure comprises titanium carbide and aluminum,
      wherein the first structure and the second structure do not extend out of the trench,
      wherein the third structure extends outside of the trench prior to exposing the semiconductor substrate to the one or more etching solutions; and
      wherein the third structure comprises a high k dielectric material; and
   exposing the semiconductor substrate to an etching solution comprising hydrogen peroxide and hydrochloric acid such that a weight ratio of hydrogen peroxide to hydrochloric acid is between about 1 and 2 resulting in a ratio of an etching rate of the first structure to an etching rate of the second structure being between about 0.2 and 5,
      wherein exposing the semiconductor substrate to the etching solution partially removes the first structure and the second structure within the trench while the third structure remains substantially intact, and
      wherein, after exposing the semiconductor substrate to the etching solution, a residual portion of the first structure and a residual portion of the second structure are disposed within the trench.

2. The method of claim 1, wherein a concentration of aluminum in the second structure is less than 70% atomic.

3. The method of claim 1, wherein the one or more etching solutions further comprise water and wherein a weight ratio of water to hydrogen peroxide in the same etching solution is between about 10 and 100.

4. The method of claim 1, wherein one or more etching solutions are maintained at a temperature of between about 25° C. and 8520 C. during etching of the first structure and the second structure.

5. The method of claim 1, the weight ratio of hydrogen peroxide to hydrochloric acid in the one or more etching solutions is between about 1 and 1.5.

6. The method of claim 1, a concentration of hydrogen peroxide in the one or more etching solutions is between 1% and 3% by weight.

7. The method of claim 1, a concentration of hydrochloric acid in the one or more etching solutions is between 0.75% and 3% by weight.

8. The method of claim 1, wherein the one or more etching solutions are maintained at a temperature of between about 50° C. and 70° C. during etching of the first structure and the second structure.

9. The method of claim 1, wherein an etching rate of the first structure or the second structure is 15 Angstroms per minute and 150 Angstroms per minute.

10. The method of claim 9, wherein an etching rate of the third structure is less than 5 Angstroms per minute.

11. The method of claim 9, wherein an etching rate of the third structure is less than 1 Angstrom per minute.

12. The method of claim 1, wherein the semiconductor substrate comprises one of silicon oxide, silicon oxynitride, or a low-k material.

13. The method of claim 1, wherein the high k dielectric material comprises at least one of hafnium oxide or zirconium oxide.

14. The method of claim 1, wherein the high k dielectric material comprises at least one hafnium silicon oxide, hafnium silicon oxynitride, hafnium tantalum oxide, hafnium titanium oxide, or hafnium zirconium oxide.

15. The method of claim 1, wherein the third structure is a layer having a thickness of between about 1 nanometers and 10 nanometers.

16. The method of claim 1, wherein the trench of the semiconductor substrate further comprises a spacer comprising at least one of silicon oxide, silicon nitride, silicon oxynitride, silicon carbide, fluoride-doped silicate glass, or a low k dielectric material.

17. The method of claim 1, wherein the first structure and the second structure are disposed between layers of the third structure within the trench.

18. The method of claim 1, wherein the first structure and the second structure form a stack of alternating layers comprising two layers of the first structure and three layers of the second structure.

* * * * *